(12) United States Patent
Grannen et al.

(10) Patent No.: US 6,392,244 B1
(45) Date of Patent: May 21, 2002

(54) ION BEAM DEPOSITION OF DIAMOND-LIKE CARBON OVERCOATS BY HYDROCARBON SOURCE GAS PULSING

(75) Inventors: Kevin J. Grannen, Fremont; Xiaoding Ma, Redwood City; Jing Gui, Fremont, all of CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/376,495

(22) Filed: Aug. 18, 1999

Related U.S. Application Data
(60) Provisional application No. 60/101,945, filed on Sep. 25, 1998.

(51) Int. Cl.[7] .......................... H05H 1/24; C23C 14/34; B05D 3/14
(52) U.S. Cl. .................. 250/492.21; 204/192.11; 427/523; 427/577; 427/528; 427/530
(58) Field of Search ............... 250/492.21; 204/192.11; 427/523, 528, 530, 577

(56) References Cited

U.S. PATENT DOCUMENTS

| | | | |
|---|---|---|---|
| 4,862,032 A | 8/1989 | Kaufman et al. ........... 313/359 |
| 5,192,523 A | 3/1993 | Wu et al. .................... 427/523 |
| 5,455,081 A | * 10/1995 | Okada et al. ................ 427/528 |
| 5,482,602 A | 1/1996 | Cooper et al. ......... 204/192.11 |
| 5,508,368 A | 4/1996 | Knapp et al. ................ 427/534 |
| 5,879,519 A | * 3/1999 | Seeser et al. .......... 204/192.12 |
| 5,888,593 A | 3/1999 | Petrmichl et al. ........... 427/563 |

OTHER PUBLICATIONS

Handbook of ION Beam Processing Technology, 1989, pp. 40–57.

* cited by examiner

*Primary Examiner*—Jack Berman
*Assistant Examiner*—Nikita Wells
(74) *Attorney, Agent, or Firm*—McDermott, Will & Emery

(57) ABSTRACT

Stable operation of an ion beam deposition (IBD) station forming part of a multi-station apparatus and formation therein of a tribologically robust DLC-type i-C:H ultra-thin protective overcoat for high recording density magnetic media are achieved by pulsing (i.e., limiting) the flow of a hydrocarbon source gas to the ion beam source to deposition intervals between substrate transfer/pressure cycling. Embodiments include utilizing a circularly-shaped, closed drift, end Hall type ion beam source as part of a multi-process station apparatus, wherein undesirable arcing of the ion beam source during substrate transfer is eliminated, or at least substantially reduced, as a result of the pulsed supply of hydrocarbon source gas to the ion beam source.

15 Claims, 1 Drawing Sheet ent application Ser. No. 60/101,945, filed Sep. 25, 1998, the
ION BEAM DEPOSITION OF DIAMOND-LIKE CARBON OVERCOATS BY HYDROCARBON SOURCE GAS PULSING

CROSS-REFERENCE TO PROVISIONAL APPLICATION

This application claims priority from provisional patent application Ser. No. 60/101,945, filed Sep. 25, 1998, the entire disclosure of which is incorporated herein by reference.

FIELD OF THE INVENTION

The present invention relates to an improved method for stably ion beam depositing (IBD) tribologically robust, diamond-like carbon ("DLC") films and coatings suitable for use as protective overcoat layers for magnetic recording media, e.g., hard disks, and a multi-process station apparatus including at least one ion beam deposition station, the apparatus being adapted for continuous, stable, automated manufacture of magnetic recording media comprising IBD i-C:H DLC protective overcoat layers formed according to the inventive methodology.

BACKGROUND OF THE INVENTION

A magnetic recording medium, e.g., a hard disk, typically comprises a laminate of several layers, including a non-magnetic substrate, such as of aluminum-magnesium (Al-Mg) alloy or a glass or glass-ceramic composite material, and formed sequentially on each side thereof: a polycrystalline underlayer, typically of chromium (Cr) or Cr-based alloy, a polycrystalline magnetic recording medium layer, e.g., of a cobalt (Co)-based alloy, a hard, abrasion-resistant, protective overcoat layer, typically carbon (C)-based, and a lubricant topcoat layer.

In operation of the magnetic recording medium, the polycrystalline magnetic recording medium layer is locally magnetized by a write transducer, or write head, to record and store information. The write transducer creates a highly concentrated magnetic field which alternates direction based upon the bits of information being stored. When the local magnetic field produced by the write transducer is greater than the coercivity of the recording medium layer, then the grains of the polycrystalline recording medium at that location are magnetized. The grains retain their magnetization after the magnetic field produced by the write transducer is removed. The direction of magnetization matches the direction of the applied magnetic field. The magnetization of the polycrystalline recording medium can subsequently produce an electrical response in a read transducer, allowing the stored information to be read.

Thin film magnetic recording media are conventionally employed in disk form for use with disk drives for storing large amounts of data in magnetizable form. Typically, one or more disks are rotated on a central axis in combination with data transducer heads. In operation, a typical contact start/stop (CSS) method commences when the head begins to slide against the surface of the disk as the disk begins to rotate. Upon reaching a predetermined high rotational speed, the head floats in air at a predetermined distance above the surface of the disk due to dynamic pressure effects caused by air flow generated between the sliding surface of the head and the disk. During reading and recording operations, the transducer head is maintained at a controlled distance from the recording surface, supported on a bearing of air as the disk rotates, such that the head can be freely moved in both the circumferential and radial directions, thereby allowing data to be recorded on and retrieved from the disk at a desired position. Upon terminating operation of the disk drive, the rotational speed of the disk decreases and the head again begins to slide against the surface of the disk and eventually stops in contact with and pressing against the disk. Thus, the transducer head contacts the recording surface whenever the disk is stationary, accelerated from the static position, and during deceleration just prior to completely stopping. Each time the head and disk assembly is driven, the sliding surface of the head repeats the cyclic sequence consisting of stopping, sliding against the surface of the disk, floating in the air, sliding against the surface of the disk, and stopping.

As a consequence of the above-described cyclic CSS-type operation, the surface of the disk or medium surface wears off due to the sliding contact if it has insufficient abrasion resistance or lubrication quality, resulting in breakage or damage if the medium surface wears off to a great extent, whereby operation of the disk drive for performing reading and reproducing operations becomes impossible. The protective overcoat layer is formed on the surface of the polycrystalline magnetic recording medium layer so as to protect the latter from friction and like effects due to the above-described sliding action of the magnetic head. Abrasion-resistant, carbon (C)-containing protective coatings have been utilized for this purpose, and are typically formed by sputtering of a carbon (C) target in an argon (Ar) atmosphere. Such amorphous carbon (a-C)-containing protective overcoat layers formed by sputtering have relatively strong graphite-type bonding, and therefore exhibit a low coefficient of friction in atmospheres containing water ($H_2O$) vapor, which characteristic is peculiar to graphite. However, the a-C layers produced in such manner have very low hardness as compared with many ceramic materials such as are employed as slider materials of thin film heads, and thus are likely to suffer from wear due to contact therewith.

In recent years, therefore, carbon-based protective overcoat layers having diamond-like hardness properties (i.e., HV of about 1,000–5,000 $kg/mm^2$) have been developed, and films of diamond-like carbon (DLC) having a high percentage of diamond-type C-C bonding have been utilized. Such DLC films exhibit a high degree of hardness due to their diamond-like $sp^3$ bonding structure, and in addition, exhibit the excellent sliding properties characteristic of carbon, thus affording improved sliding resistance against sliders composed of high hardness materials. Such DLC films are generally obtained by DC or RF magnetron sputtering of a carbon target in a gas atmosphere comprising a mixture of Ar gas and a hydrocarbon gas, e.g., methane ($CH_4$), or hydrogen ($H_2$) gas. The thus-obtained films exhibit DLC properties when a fixed amount of hydrogen is incorporated therein. Incorporation of excessive amounts of hydrogen in the films leads to gradual softening, and thus the hydrogen content of the films must be carefully regulated.

Amorphous, hydrogenated carbon (a-C:H) films obtained by sputtering of carbon targets in an Ar+$H_2$ gas mixture exhibiting diamond-like properties have also been developed for improving the tribological performance of disk drives; however, the electrical insulating properties of such type films lead to undesirable electrical charge build-up or accumulation over time during hard disk operation which can result in contamination, glide noise, etc. In order to solve this problem without sacrifice or diminution of the advantageous mechanical properties of such a-C:H films, attempts have been made to dope or otherwise incorporate nitrogen (N) atoms into the a-C:H films, in view of a substantial decrease in electrical resistivity and optical band gap ($E_{BG}$) exhibited by such N-doped a-C:H films relative to undoped films. In addition to these hydrogen-containing DLC materials, amorphous as well as crystalline DLC films and coatings comprising compounds of carbon and nitrogen ($CN_x$) have also been developed and evaluated for use as protective overcoat layers for magnetic recording media.

However, the continuous increase in areal recording density of magnetic recording media requires a commensurately lower flying height. Therefore, it would be advantageous to reduce the thickness of the carbon-based protective overcoat layer to below about 100 Å without incurring adverse consequences. Conventional sputtered a-C:H and a-C:N materials are difficult to uniformly deposit and generally do not function satisfactorily in hard disk applications at thicknesses of about 100 Å or less. The use of alternative deposition techniques for developing thinner and harder DLC layers having the requisite mechanical and tribological properties has been examined, such as, for example, chemical vapor deposition (CVD), ion beam deposition (IBD), and cathodic arc deposition (CAD) techniques. Of these, the IBD method has demonstrated ability to be utilized for forming hydrogenated ion-beam deposited carbon (IBD i-C:H) films that exhibit superior tribological performance at thicknesses below about 100 Å.

Conventional gridded, or more commonly, gridless, circularly-configured ion beam sources are typically utilized for the deposition of IBD i-C:H films or coatings, such as end-Hall and closed-drift end-Hall sources, and are extensively described in *Handbook of Ion Beam Processing Technology*, J. J. Cuomo et al, editors, Noyes Publications, Park Ridge, N.J., pp. 40–54, and in U.S. Pat. No. 4,862,032, the entire disclosure of which is incorporated herein by reference. Such type ion beam sources typically operate at pressures below about 1 mTorr in order to minimize the collision of energetic ions forming the ion beam with ambient energy molecules of the background gas, enable formation of an intense, highly ionized plasma, and to obtain carbon films exhibiting optimum material properties, e.g., hardness, absence of defects, etc., for use as protective overcoat layers in hard disk applications. DLC materials in film or coating form can be produced on suitable hard disk substrates located in the path of the ion beam produced by such gridless ion sources by introducing a hydrocarbon gas ($C_xH_y$, where x=1–4 and y=2–10), e.g., acetylene ($C_2H_2$), into the ion beam exiting the orifice of the ion beam source or by passing the hydrocarbon gas through the source from the rear thereof. However, the ion beam source is typically integrated with sputtering equipment for continuous, automated manufacture of hard disks such as are employed in computers, and, as a consequence, tradeoffs and/or compromises have been made with respect to material properties and ion beam source operating parameters.

More specifically, a typical automated hard disk manufacturing system includes at least one linearly elongated or circularly-shaped main vacuum chamber having a number of process stations serially arranged therein, each dedicated for deposition of a distinct material layer on the hard disk substrate or to an other type of treatment, e.g., etching, cleaning, etc. When such systems are employed for the manufacture of magnetic recording media, e.g., hard disks, each process station typically comprises a sub-chamber maintained under high vacuum conditions, e.g., for sequentially depositing on the hard disk substrate, as by cathode sputtering, a respective one of the various layers comprising the magnetic recording medium. Workpiece (i.e., substrate) handling/transfer means are provided for transferring the substrates, in sequence, from a preceding station to a following station, with substantially distinct atmospheric conditions being maintained within each sub-chamber, depending upon the particular processing performed therein.

As indicated supra, IBD i-C:H protective overcoat layers are superior to sputtered a-C:H protective overcoat layers, particularly when utilized in ultra-thin thicknesses (i.e., <100 Å) as required for very high recording density media. As a consequence, when such type multi-process station apparatus is utilized for the manufacture of such high recording density magnetic media, an ion beam source, typically a gridless source such as an end-Hall or closed-drift end-Hall source, is located in an additional sub-chamber within the main chamber and operatively connected therewith by suitable disk transfer means. The ion beam source is supplied with hydrocarbon and argon gases for forming the DLC-type IBD i-C:H protective overcoat layer over the sputtered polycrystalline magnetic recording medium layer. During the ion beam deposition stage, the anode-to-ground voltage of the ion beam source is at or below a level at which arcing or other deleterious effects may occur, typically about 80 V for an end-Hall type source. After deposition of the DLC-type IBD i-C:H layer on the disk substrates is complete, the disk is transferred out of the ion beam deposition (IBD) station/sub-chamber and replaced with a fresh, uncoated disk. However, the transient lowering of the pressure in the IBD chamber which occurs during substrate transfer as a result of exposure to the additional pumping capacity of the main vacuum chamber including process stations operating at substantially lower ambient pressures (typically sputtering stations when such multi-process station apparatus are employed for the manufacture of magnetic recording media), may amount to as much as 50% of the pressure level during the IBD phase and must be taken into account. As a consequence of the transiently lowered pressure in the IBD chamber, the anode potential frequently increases well above 80 V, in some instances reaching about 90–100 V, thereby substantially increasing the likelihood of highly undesirable arcing and particle generation within the ion beam generator and associated vacuum chamber. Such arcing can damage the structural components of the ion beam source as well as the power supply. Moreover, arc-generated particles can contaminate the deposited film, resulting in degradation of film quality, and in extreme cases, loss of product. Stable operation of such hybrid type sputtering/ion beam deposition systems for the formation of tribologically robust DLC materials suitable for use as protective coatings in hard disk manufacture therefore requires an operating regime where the anode-to-ground voltage does not undesirably increase to an arc-producing value upon lowering of the pressure in the IBD sub-chamber during substrate (i.e., disk) transfer.

In addition to the above, the conventional multi-process station methodology incurs the further drawbacks of contamination of the other processing stations with hydrocarbon gases leading to degradation in magnetic recording layer properties and excessive accumulation of potentially explosive hydrocarbon gases in the cryopumps employed for evacuating the main vacuum chamber.

Accordingly, there exists a need for an improved method for stably operating a multi-processing station apparatus including an ion beam processing station for forming very thin, high quality, IBD i-C:H and similar DLC-type abrasion-resistant materials for use as protective overcoat layers for high-density magnetic media, which method overcomes the above-described drawbacks and disadvantages associated with the conventional hybrid IBD/sputtering technology, is simple, cost effective, and fully compatible with the productivity and throughput requirements of automated manufacturing technology.

The present invention fully addresses and solves the above-described problems attendant upon the manufacture of ultra-thin, abrasion-resistant protective overcoat layers suitable for use with high-density magnetic recording media, such as are employed in hard drive applications, while maintaining full compatibility with all mechanical and electrical aspects of conventional disk drive technology.

DISCLOSURE OF THE INVENTION

An advantage of the present invention is an improved method for providing continuous, stable operation of an ion beam source comprising at least one process station of a multi-process station apparatus for continuous, automated manufacture of magnetic recording media, which method eliminates undesirable arcing and particle generation within the ion beam source.

Another advantage of the present invention is an improved method for IBD of ultra-thin, i.e., <100 Å thick, tribologically robust i-C:H and similar type DLC coatings suitable for use as protective overcoat layers for high-density magnetic recording media.

Still another advantage of the present invention is an improved, stable-operating, multi-process station apparatus suitable for use in the continuous, automated manufacturing of magnetic recording media and comprising at least one ion beam processing station.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of stably operating an ion beam processing station for treating at least one workpiece therein, the ion beam processing station comprising an ion beam source located within a sub-chamber forming part of a multi-process station apparatus including a main chamber, which method comprises the sequential steps of:

(a) supplying the ion beam source with a flow of at least one inert gas to generate therefrom a first ion beam comprising ions of the at least one inert gas;

(b) providing at least one workpiece within the ion beam processing station;

(c) initiating a flow of at least one reactant source gas to the ion beam source in addition to the flow of the at least one inert gas to generate therefrom a second ion beam comprising ions derived from the at least one reactant source gas;

(d) treating the at least one workpiece with the second ion beam for a preselected interval;

(e) terminating the flow of the at least one reactant source gas to the ion beam source after completion of the preselected interval; and (f) removing the at least one workpiece from the ion beam processing station and repeating steps (a)–(f) with a fresh workpiece, as desired;

wherein all operating parameters of the ion beam source except for the flow of the at least one reactant gas only during step (c) and the pressure within the sub-chamber are maintained substantially constant during steps (a)–(f).

According to embodiments of the present invention, the method further comprises maintaining at least a preselected minimum pressure within the sub-chamber during steps (a)–(f), thereby eliminating, or at least substantially reducing, arcing and/or particle formation within the ion beam source.

According to further embodiments of the present invention, step (b) comprises providing within the ion beam processing station at least one workpiece comprising a substrate for a magnetic recording medium and including a surface with a plurality of layers formed thereover, the method further comprising depositing the plurality of layers over the substrate surface in the multi-processing station apparatus, the plurality of layers including at least one layer of magnetic recording material having an exposed upper surface; step (c) comprises initiating a flow of hydrocarbon gas of formula $C_xH_y$, where x=1–4 and y=2–10, to the ion beam source to generate therefrom a second ion beam comprising C, H, and inert gas-containing ions; and step (d) comprises treating the substrate by directing the second ion beam onto the exposed upper surface of the at least one layer of magnetic recording material to deposit thereon an abrasion-resistant, DLC-type protective overcoat layer of IBD i-C:H.

According to further embodiments of the present invention, step (a) comprises supplying the ion beam source with a flow of argon (Ar) gas as the at least one inert gas to generate the first ion beam therefrom; step (c) comprises initiating a flow of acetylene ($C_2H_2$) gas to the ion beam source as the hydrocarbon gas to generate the second ion beam therefrom; and step (d) comprises depositing a layer of IBD i-C:H up to about 100 Å thick on the exposed surface of the at least one layer of magnetic recording material.

According to particular embodiments of the present invention, the ion source comprises a gridless, circularly-shaped, closed-drift, end-Hall ion source; step (a) comprises generating the first ion beam from the ion source under the following operating conditions:

argon gas flow: about 20 to about 50 sccm
anode current: about 4 to about 12 amperes
anode voltage: about 80 volts
magnet current: about 2 to about 8 amperes
pressure: at least about 0.75 to about 1.0 mTorr
ion energies about 60 to about 100 eV
beam width at substrate: about 4 to about 6 inches diameter;

and step (c) comprises further supplying the ion beam source with the hydrocarbon gas at a flow rate of about 15 to about 40 sccm for a preselected interval of about 2 to about 10 seconds to generate the second ion beam therefrom, the pressure within the sub-chamber being at least about 1.5 to about 2.0 mTorr; the method further comprising maintaining a minimum pressure of at least about 0.75 to about 1.0 mTorr within the sub-chamber during steps (a)–(f), thereby eliminating, or at least substantially reducing, arcing and/or particle formation within the ion beam source.

According to yet further embodiments of the present invention, step (d) comprises depositing an IBD i-C:H DLC-type protective overcoat layer up to about 100 Å thick; step (b) comprises supplying the ion beam deposition station with a non-magnetic hard disk substrate, comprising a material selected from the group consisting of Al-Mg alloys, glass, and glass-ceramic composite materials; the plurality of layers formed on the surface of the disk substrate comprise, in sequence from the surface, a polycrystalline underlayer comprising Cr or a Cr-based alloy, and a polycrystalline magnetic recording medium layer comprising a Co-based alloy; and the method further comprises step (g) of depositing a lubricant topcoat over the IBD i-C:H protective overcoat layer.

According to another aspect of the present invention, a method of stably operating an ion beam processing station for forming a layer of an abrasion-resistant, DLC-type protective overcoat material on a substrate positioned therein, the ion beam processing station comprising an ion beam source located within a sub-chamber forming part of a multi-process station apparatus including a main chamber, which method comprises the sequential steps of:

(a) supplying the ion beam source with a flow of at least one inert gas to generate therefrom a first ion beam comprising ions of the at least one inert gas;

(b) positioning within the ion beam processing station at least one workpiece comprising a substrate including a deposition surface;

(c) supplying the ion beam source with a flow of a hydrocarbon gas in addition to the flow of the inert gas to generate therefrom a second ion beam comprising C, H, and inert gas ions;

(d) directing the second ion beam onto the surface of the substrate for a preselected interval to deposit a layer of IBD i-C:H thereon;

(e) terminating the flow of hydrocarbon gas after completion of the preselected interval; and (f) removing the workpiece having the layer of IBD i-C:H deposited thereon and repeating steps (a)–(f) with a fresh workpiece, as desired;

wherein all operating parameters of the ion beam source except for the flow of hydrocarbon gas only during step (c) and the pressure within the sub-chamber are maintained substantially constant during steps (a)–(f).

According to embodiments of the present invention, the ion beam source comprises a gridless, circularly-shaped, closed-drift, end-Hall ion beam source;

step (a) comprises generating the first ion beam under the following operating conditions:
argon gas flow: about 20 to about 50 sccm
anode current: about 4 to about 12 amperes
anode voltage: about 80 volts
magnet current: about 2 to about 8 amperes
pressure: at least about 0.75 to about 1.0 mTorr
ion energies: about 60 to about 100 eV
beam width at substrate: about 4 to about 6 inches diameter;

step (b) comprises positioning within the ion beam processing station a magnetic disk substrate as the workpiece, the magnetic disk substrate comprising a plurality of layers formed over a surface of the substrate, the plurality of layers including at least one layer of a magnetic recording material having an exposed upper surface;

step (c) comprises further supplying the ion beam source with acetylene ($C_2H_2$) gas at a flow rate of about 15 to about 40 sccm for an interval of about 2 to about 10 seconds to generate the second ion beam therefrom at a pressure within the sub-chamber of at least about 1.5 to about 2.0 mTorr; and step (d) comprises depositing a layer of IBD i-C:H up to about 100 Å thick.

According to still another aspect of the present invention, an apparatus comprises a main vacuum chamber having therein a plurality of sub-chambers defining a plurality of workpiece processing stations, at least one of the plurality of processing stations being an ion beam processing station comprising an ion beam source, gas supply means, and means for transferring workpieces into and out of the at least one ion beam processing station; and means for stably operating the ion beam source during ion beam processing of the workpiece and during workpiece transfer.

According to embodiments of the present invention, the ion source comprises a gridless, circularly-shaped end-Hall source or a closed drift end-Hall source; and the plurality of workpiece processing stations are linearly or circularly arranged.

Additional advantages of the present invention will become readily apparent to those skilled in the art from the following description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the description is to be regarded as illustrative in nature, and not as limitative.

BRIEF DESCRIPTION OF THE DRAWING

The following detailed description of the embodiment of the present invention can best be understood when read in conjunction with the following drawings, wherein.

DESCRIPTION OF THE INVENTION

Figure 1:
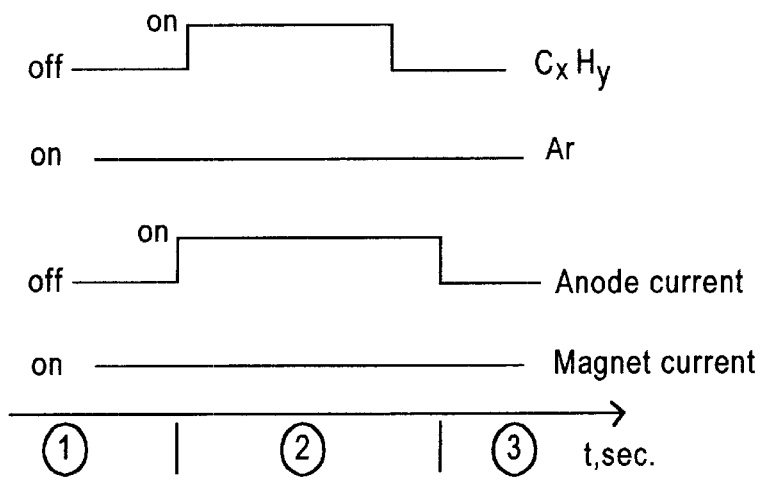
FIGS. 1–3 illustrate, in graphical form, the variation of various operating parameters of an ion beam source operated according to respective regimes for forming IBD i-C:H DLC-type protective overcoat layers on magnetic disk substrates.

The present invention addresses and solves several problems attendant upon the use of a multi-station apparatus for continuous, automated manufacture of a high density magnetic recording medium, including problems arising from the use of a hydrocarbon reactant source gas for ion beam generation and the transient reduction of pressure within a sub-chamber utilized for IBD of i-C:H DLC-type films or coatings which occurs during non-IBD intervals, e.g., during substrate transfer operations for removing an IBD-coated workpiece substrate from the sub-chamber and its replacement by a fresh, uncoated substrate. More specifically, the inventive methodology provides continuous, stable, non-arcing operation of an ion beam source of an ion beam deposition station utilized for IBD of an i-C:H abrasion-resistant, protective overcoat layer on a substrate comprising a magnetic recording layer, when the ion beam deposition station forms part of a multi-process station apparatus utilized for automated manufacturing of a magnetic medium involving serial deposition of a plurality of layers on a substrate.

According to the present invention, the problems of unstable ion beam source operation during IBD i-C:H processing, including arcing and particle formation due to a transient increase in anode-to-ground voltage above a maximum tolerable value, as well as contamination of adjacent processing stations, typically sputter deposition stations, by hydrocarbon reactant source gas(es) utilized for ion beam generation in an ion beam deposition station are substantially eliminated, or at least minimized, by continuous operation of the ion source beam source under a gas flow regime wherein hydrocarbon reactant source gas is supplied thereto (i.e., pulsed) only during IBD i-C:H deposition intervals. All other operating conditions/parameters of the ion beam source except for the pressure therein, e.g., inert gas flow, magnet current, and anode current, are maintained substantially constant during non-deposition intervals, e.g., during substrate transfer into and out of the ion beam deposition station.

The present invention is based, in part, upon recognition that stable operation of an ion beam source which forms a portion of a multi-process station vacuum deposition apparatus requires a pressure regime where DLC i-C:H films or coatings can be deposited with tribologically usefull properties during a deposition phase, but also where the anode-to-ground voltage does not increase to an arc-producing value during a non-deposition phase, such as during workpiece (e.g., hard disk substrate) transfer. The present invention is based upon the further recognition that the undesirable increase in anode-to-ground voltage which occurs during substrate transfer is largely due to a decrease in the pressure within the IBD sub-chamber resulting from the additional pumping capacity resulting from transient exposure to the main vacuum chamber atmosphere during substrate transfer.

By way of example, the pressure within the IBD sub-chamber may experience a transient reduction of 50% or more during the non-deposition phase involving substrate transfer. As a consequence, the anode-to-ground potential of the ion beam source can increase from the stable, non-arcing 80 V level utilized during the deposition phase to e.g., 90–100 V. Operation of the ion beam source within the 90–100 V anode-to-ground region may cause arcing within the ion beam source with concomitant structural damage to the components thereof, as well as particle generation leading to contaminated and uneven thickness i-C:H films, and thus is a highly undesirable occurrence.

In addition to the above, the use of hydrocarbon reactant source gases for ion beam generation incurs a concern as to safety in that an accumulation of hydrocarbon gas in the cryopumps utilized for providing the necessary vacuum in the main and various sub-chambers of the multi-station apparatus can present an explosion hazard. Moreover, it is important to prevent, or at least minimize, contamination of the other processing stations, e.g., sputtering stations, in order to maintain desirable magnetic properties of the magnetic recording layer(s).

Conventional gridded and gridless circularly-shaped ion beam sources, e.g., end-Hall and closed drift end-Hall sources as described supra, typically operate at pressures below 1 mTorr to minimize the collision of energetic ions with ambient energy molecules in the background gas and enable the production of an intense, highly-ionized plasma. Typically, such ion beam sources are operated in a continuous mode with argon (Ar) and/or oxygen ($O_2$). DLC-type carbon (C)-containing materials can be produced with such ion beam sources by the introduction of a hydrocarbon ($C_xH_y$, where x=1–4 and y=2–10) gas in front of or through the back of the source. However, the integration of ion beam technology into multi-station sputtering apparatus for the deposition of DLC-type C-containing protective overcoats in computer hard disk manufacturing has led to tradeoffs in ion source operating parameters leading to less than optimal performance.

For example, in the case of sputter processing of disk substrates in a multi-processing station apparatus comprising a main vacuum chamber including therein a plurality of processing stations each comprising a sub-chamber, a disk substrate moves sequentially (linearly or circularly) from one processing station to the next station for deposition thereon of the requisite layers. For optimal operation of an ion beam source for deposition of DLC-type IBD i-C:H in such an environment, stable operation of the ion beam source is a prerequisite during deposition of the IBD i-C:H layer and during transfer of the coated disk from the IBD station to the next station and its replacement with a fresh, uncoated disk. This in turn requires the anode-to-ground voltage of the ion beam source to remain substantially constant during the deposition and disk transfer phases of the operating regime. However, as indicated above, the substantial variation in the pressure within the IBD station which occurs during the deposition and transfer phases may result in an increase in anode-to-ground voltage sufficient to initiate arcing therein or other undesirable effects, e.g., particle generation leading to contamination or unevenness of the deposited i-C:H layer.

Figure 2:
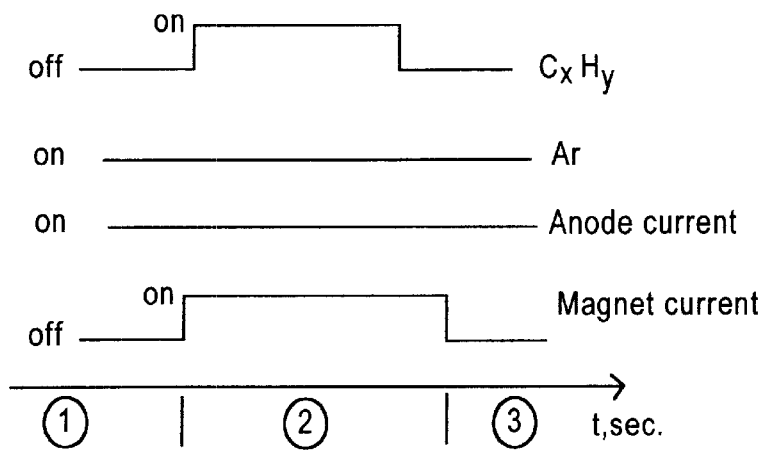

Adverting to FIGS. 1–2, illustrated therein are two possible operating regimes which may be considered for obtaining stable operation of an ion beam source when utilized within the above context, e.g., for forming DLC-type IBD i-C:H layers in an ion beam processing station forming part of a multi-station processing apparatus comprising a main vacuum chamber with a plurality of sub-chambers therein. In each instance, the horizontal direction denotes time, e.g., in seconds, during a sequence comprising, from left-to-right: (1) fresh disk supply to the ion beam processing station; (2) IBD of DLC-type i-C:H on the disk surface; and (3) removal of the coated disk from the ion beam processing station (and its replacement with a fresh, uncoated disk, as desired).

In both instances, the flow of hydrocarbon gas to the ion beam processing station is initiated after disk entry and is terminated prior to disk removal for transfer to the next processing station, in order to prevent, or at least minimize, hydrocarbon gas from entering, and thus contaminating, the other process stations, particularly the magnetic recording layer deposition station(s), and to prevent, or at least minimize, accumulation of the hydrocarbon gas in the vacuum chamber cryopumps and thus reduce the likelihood of explosion. According to the process regime illustrated in FIG. 1, operation of the ion beam source is interrupted during disk transfer by terminating the flow of anode current; whereas, according to the process regime illustrated in FIG. 2, ion beam source operation is interrupted during disk transfer by terminating the flow of magnet current. However, each of the proposed operating regimes illustrated in FIGS. 1–2 is impractical in view of the long ramp-up and ramp-down time of the ion beam source, as well as the inability of the associated hardware and electronics to quickly stabilize upon on-off cycling operation.

Figure 3:
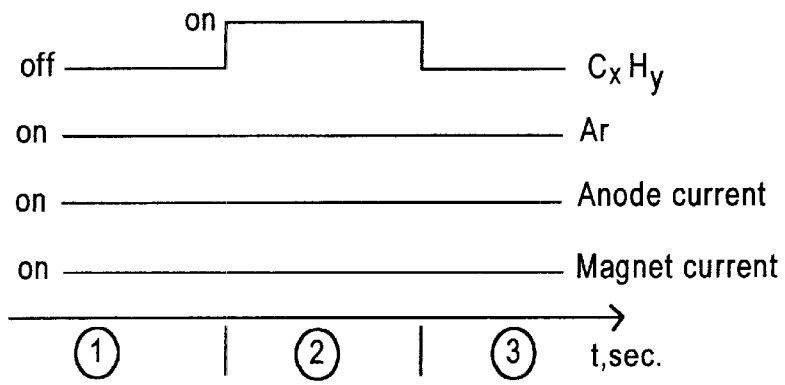

Referring now to FIG. 3, shown therein is an operating regime which avoids the above-described drawbacks associated with the operating regimes illustrated in FIGS. 1–2, in that rather than pulsing the ion beam source by turning it off during periods of disk transfer, the flow of hydrocarbon gas to the ion beam source is pulsed (i.e., turned off) during disk transfer periods, while all other operating conditions/parameters of the ion beam source, except for the pressure within the IBD station, are maintained substantially constant during the substrate transfer/pressure cycling regime. As a consequence, the ion beam source can be operated continuously and stably throughout the disk transfer/deposition/disk transfer pressure cycling by maintaining the pressure within the IBD station at or above a minimum pressure level (e.g., at least about 0.75 to about 1.0 V) necessary for preventing the anode-to-ground voltage from exceeding a level (e.g., about 80 V) above which arcing may occur.

The present invention thus provides a disk transfer/pressure cycling regime where the ion beam source can continuously operate stably and reliably during the deposition phase to produce high quality, tribologically robust i-C:H DLC-type coatings and continue to operate reliably and stably during the non-deposition disk transfer phase. In addition, the inventive methodology can be employed with a variety of hydrocarbon gases, e.g., acetylene ($C_2H_2$), while eliminating, or at least minimizing, hydrocarbon build-up in the main vacuum chamber including sputtering station(s) for deposition of at least one magnetic recording layer, thereby preventing deterioration of the magnetic properties thereof.

In addition to the above, stable operation of the ion beam deposition station is obtained according to the inventive methodology by establishing a disk transfer/pressure cycling regime wherein the combined inert gas/hydrocarbon source gas pressure within the IBD sub-chamber during the i-C:H deposition phase is maintained at a value higher than that previously employed, whereby protective coatings having excellent tribological properties at ultra-thin thicknesses below about 100 Å are obtained and the transient reduction in IBD sub-chamber pressure during the subsequent non-deposition disk transfer phase does not result in a pressure reduction sufficient to raise the anode-to-ground voltage to a level at which arcing and/or particle generation can occur. By way of example, but not limitation, the pressure in the IBD sub-chamber resulting from hydrocarbon and inert gas (e.g., Ar) flow thereinto during the deposition phase, according to the present invention, may be at least about 1.5–2.0 mTorr, in which instance the transient reduced pressure obtained during the non-deposition disk transfer phase is at least about 0.75–1.0 mTorr, assuming a 50% transient pressure reduction. As indicated above, the attendant increase in anode-to-ground voltage obtained with such pressure regime will not be sufficient to achieve arcing conditions; hence, stable, non-arcing operation of the ion beam source will result.

EXAMPLE

A circularly-shaped, closed-drift end-Hall ion beam source (Diamonex, Inc., Allentown, Pa.) was utilized under continuous, stable operating conditions, without arcing and/or particle formation, as part of a multi-process station apparatus under the following operating conditions/parameters to form IBD i-C:H DLC-type protective overcoat layers about 50 Å to about 100 Å thick on hard disk substrates:

Non-deposition (i.e., disk transfer) phase
  argon gas flow: about 20 to about 50 sccm
  anode current: about 4 to about 12 amperes
  anode voltage: about 80 volts
  magnet current: about 2 to about 8 amperes
  pressure: at least about 0.75 to about 1.0 mTorr
  ion energies: about 60 to about 100 eV
  beam width at substrate: about 4 to about 6 inches diameter Deposition phase
  argon gas flow: about 20 to about 50 sccm
  anode current: about 4 to about 12 amperes
  anode voltage: about 80 volts
  magnet current: about 2 to about 8 amperes
  hydrocarbon gas flow: about 15 to about 40 sccm
  pressure: about 1.5 to about 2.0 mTorr
  ion energies: about 60 to about 100 eV
  beam width at substrate: about 4 to about 6 inches diameter
  deposition interval: variable from about 2 to about 10 seconds.

The present invention thus provides a number of advantages over the conventional methodology for forming IBD i-C:H layers and coatings according to a substrate transfer/pressure cycling regime which provides for continuous, stable operation of the ion beam source and eliminates, or at least substantially reduces, undesirable arcing and particle generation phenomena typically associated with the use of ion beam sources employed as part of multi-process station apparatus according to conventional practices. In addition, the inventive methodology is fully compatible with all other aspects of magnetic recording media manufacturing technology and is readily adapted for use in automated hard-disk fabrication processing.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials, structures, and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of stably operating an ion beam processing station for forming a layer of an abrasion-resistant, DLC-type protective overcoat material on a workpiece positioned therein, said ion beam processing station comprising an ion beam source located within a sub-chamber forming part of a multi-process station apparatus including a main chamber, which method comprises the sequential steps of:

(a) supplying said ion beam source with a flow of at least one inert gas to generate therefrom a first ion beam comprising ions of said at least one inert gas;

(b) positioning within said ion beam processing station at least one workpiece, each workpiece comprising a substrate including a deposition surface;

(c) supplying said ion beam source with a flow of a hydrocarbon reactant source gas in addition to said flow of said at least one inert gas to generate therefrom a second ion beam comprising C, H and inert gas ions;

(d) directing said second ion beam onto said deposition surface of said substrate for a preselected interval to deposit a layer of IBD I-C:H thereon; and (e) terminating said flow of said hydrocarbon reactant source gas after completion of said preselected interval, wherein all operating parameters of said ion beam source except for said flow of said hydrocarbon reactant source gas only during step (c) and the pressure within the sub-chamber are maintained substantially constant during steps (a)–(e).

2. The method according to claim 1, further comprising maintaining at least a preselected minimum pressure within said sub-chamber during steps (a)–(f), thereby eliminating, or at least substantially reducing, arcing and/or particle formation within said ion beam source.

3. The method according to claim 1, wherein:

step (b) comprises providing within said ion beam processing station at least one workpiece comprising a substrate for a magnetic recording medium and including a surface with a plurality of layers formed thereover, the method further comprising depositing said plurality of layers over said substrate surface in said multi-process station apparatus, said plurality of layers including at least one layer of magnetic recording material having an exposed upper surface.

4. The method according to claim 3, wherein:

step (c) comprises initiating a flow of hydrocarbon gas of formula $C_xH_y$, where x=1–4 and y=2–10, to said ion beam source to generate therefrom a second ion beam comprising C, H, and inert gas-containing ions; and step (d) comprises treating said substrate by directing said second ion beam onto said exposed upper surface of said at least one layer of magnetic recording material to deposit thereon an abrasion-resistant, DLC-type protective overcoat layer of IBD i-C:H.

5. The method according to claim 4, wherein;

step (a) comprises supplying said ion beam source with a flow of argon (Ar) gas as said at least one inert gas to generate said first ion beam therefrom;

step (c) comprises initiating a flow of acetylene ($C_2H_2$) gas to said ion beam source as said hydrocarbon gas to generate said second ion beam therefrom; and step (d) comprises depositing a layer of IBD i-C:H up to about 100 Å thick on said exposed surface of said at least one layer of magnetic recording material.

6. The method according to claim 4, wherein said ion source comprises a gridless, circularly-shaped, closed drift, end Hall ion source;

step (a) comprises generating said first ion beam from said ion source under the following operating conditions:
argon gas flow: about 20 to about 50 sccm
anode current: about 4 to about 12 amperes
anode voltage: about 80 volts
magnet current: about 2 to about 8 amperes
pressure: at least about 0.75 to about 1.0 mTorr
ion energies: about 60 to about 100 eV
beam width at substrate: about 4 to about 6 inches diameter; and step (c) comprises further supplying said ion beam source with said hydrocarbon gas at a flow rate of about 15 to about 40 sccm for a preselected interval of about 2 to about 10 seconds to generate said second ion beam therefrom, the pressure within said sub-chamber being at least about 1.5 to about 2.0 mTorr.

7. The method according to claim 6, further comprising maintaining at least a preselected minimum pressure within said sub-chamber during steps (a)–(e), thereby eliminating, or at least substantially reducing, arcing and/or particle formation within said ion beam source.

8. The method according to claim 7, wherein said preselected minimum pressure is at least about 0.75 to about 1.0 mTorr.

9. The method according to claim 4, wherein step (d) comprises depositing an IBD i-C:H DLC-type protective overcoat layer up to about 100 Å thick.

10. The method according to claim 4, wherein:

step (b) comprises supplying said ion beam deposition station with a non-magnetic hard disk substrate.

11. The method according to claim 10, wherein said non-magnetic hard disk substrate comprises a material selected from the group consisting of:
an Al-Mg alloy, glass, and glass-ceramics.

12. The method according to claim 11, wherein said plurality of layers comprises, in sequence from said substrate surface, a polycrystalline underlayer comprising Cr or a Cr-based alloy, and a polycrystalline magnetic recording medium layer comprising a Co-based alloy.

13. The method according to claim 10, further comprising:

(g) depositing a lubricant topcoat layer over said IBD i-C:H protective overcoat layer.

14. A method of stably operating an ion beam processing station for forming a layer of an abrasion-resistant, DLC-type protective overcoat material on a substrate positioned therein, said ion beam processing station comprising an ion beam source located within a sub-chamber forming part of a multi-process station apparatus including a main chamber, which method comprises the sequential steps of:

(a) supplying said ion beam source with a flow of at least one inert gas to generate therefrom a first ion beam comprising ions of said at least one inert gas;

(b) positioning within said ion beam processing station at least one workpiece comprising a substrate including a deposition surface;

(c) supplying said ion beam source with a flow of a hydrocarbon gas in addition to said flow of said inert gas to generate therefrom a second ion beam comprising C, H, and inert gas ions;

(d) directing said second ion beam onto the surface of said substrate for a preselected interval to deposit a layer of IBD i-C:H thereon;

(e) terminating said flow of said hydrocarbon gas after completion of said preselected interval; and (f) removing said workpiece having said layer of IBD i-C:H deposited thereon and repeating steps (a)–(f) with a fresh workpiece, as desired;

wherein all operating parameters of said ion beam source except for said flow of said hydrocarbon gas only during step (c) and the pressure within said sub-chamber are maintained substantially constant during steps (a)–(f).

15. The method according to claim 14, wherein said ion beam source comprises a gridless, circularly-shaped, closed drift, end Hall ion beam source;

step (a) comprises generating said first ion beam under the following operating conditions:
argon gas flow: about 20 to about 50 sccm
anode current: about 4 to about 12 amperes
anode voltage: about 80 volts
magnet current: about 2 to about 8 amperes
pressure: at least about 0.75 to about 1.0 mTorr
ion energies: about 60 to about 100 eV beam width at substrate: about 4 to about 6 inches diameter;

step (b) comprises prositioning within said ion beam processing station a magnetic disk substrate as said workpiece, said magnetic disk substrate comprising a plurality of layers formed over a surface of said substrate, said plurality of layers including at least one layer of a magnetic recording material having an exposed upper surface;

step (c) comprises further supplying said ion beam source with acetylene ($C_2H_2$) gas at a flow rate of about 15 to about 40 sccm for an interval of about 2 to about 10 seconds to generate said second ion beam therefrom at a pressure within said sub-chamber of at least about 1.5 to about 2.0 mTorr; and step (d) comprises depositing a layer of IBD i-C:H up to about 100 Å thick.

* * * * *